(12) United States Patent
Kawai

(10) Patent No.: US 12,010,794 B2
(45) Date of Patent: *Jun. 11, 2024

(54) PRINTED WIRING BOARD AND METHOD FOR MANUFACTURING THE SAME

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,492

(22) Filed: Mar. 31, 2022

(65) Prior Publication Data

US 2022/0330428 A1 Oct. 13, 2022

(30) Foreign Application Priority Data

Apr. 8, 2021 (JP) .................................. 2021-065911

(51) Int. Cl.
*H05K 1/11* (2006.01)
*H05K 3/40* (2006.01)

(52) U.S. Cl.
CPC ............. *H05K 1/11* (2013.01); *H05K 3/4007* (2013.01); *H05K 2201/0341* (2013.01); *H05K 2201/0367* (2013.01); *H05K 2203/043* (2013.01)

(58) Field of Classification Search
CPC .................. H05K 1/11; H05K 3/4007; H05K 2201/0341; H05K 2201/0367; H05K 2203/043; H01L 24/16; H01L 24/81; H01L 2224/16225; H01L 2224/81192; H01L 2224/81801; H01L 2924/1434
See application file for complete search history.

(56) References Cited

U.S. PATENT DOCUMENTS

| 8,149,585 | B2 * | 4/2012 | Kawano | H01L 23/147 361/782 |
| 9,620,446 | B2 * | 4/2017 | Shimizu | H05K 1/115 |
| 2008/0308931 | A1 * | 12/2008 | Rinne | H05K 3/243 257/737 |
| 2009/0294962 | A1 * | 12/2009 | Hsu | H01L 23/49866 257/772 |
| 2017/0250153 | A1 * | 8/2017 | Kikuchi | H01L 24/81 |

(Continued)

FOREIGN PATENT DOCUMENTS

JP 2010-129996 A 6/2010

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a base insulating layer, a conductor layer formed on the base insulating layer and including conductor pads, a solder resist layer formed on the base insulating layer such that the solder resist layer is covering the conductor layer and having openings exposing the conductor pads, respectively, and plating bumps formed on the conductor pads such that each of the plating bumps includes a base plating layer formed in a respective one of the openings of the solder resist layer, and a top plating layer formed on the base plating layer. The plating bumps are formed such that the base plating layer has an upper surface and a side surface including a portion protruding from the solder resist layer and having a rough surface and that the top plating layer has a hemispherical shape and is covering only the upper surface of the base plating layer.

20 Claims, 3 Drawing Sheets

(56) References Cited

U.S. PATENT DOCUMENTS

2019/0304942 A1* 10/2019 Takeuchi ............ H01L 21/4853
2021/0037660 A1*  2/2021 Kawai .................... H05K 1/111
2022/0330427 A1* 10/2022 Kobayashi ............. H05K 3/181

* cited by examiner

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2021-065911, filed Apr. 8, 2021, the entire contents of which are incorporated herein by reference.

BACKGROUND OF THE INVENTION

Field of the Invention

The present invention relates to a printed wiring board having multiple plating bumps, and a method for manufacturing the printed wiring board.

Description of Background Art

Japanese Patent Application Laid-Open Publication No. 2010-129996 describes a printed wiring board having multiple plating bumps. The entire contents of this publication are incorporated herein by reference.

SUMMARY OF THE INVENTION

According to one aspect of the present invention, a printed wiring board includes a base insulating layer, a conductor layer formed on the base insulating layer and including conductor pads, a solder resist layer formed on the base insulating layer such that the solder resist layer is covering the conductor layer and having openings exposing the conductor pads, respectively, and plating bumps formed on the conductor pads such that each of the plating bumps includes a base plating layer formed in a respective one of the openings of the solder resist layer, and a top plating layer formed on the base plating layer. The plating bumps are formed such that the base plating layer has an upper surface and a side surface including a portion protruding from the solder resist layer and having a rough surface and that the top plating layer has a hemispherical shape and is covering only the upper surface of the base plating layer.

According to another aspect of the present invention, a method for manufacturing a printed wiring board includes forming a conductor layer including conductor pads on a base insulating layer, forming a solder resist layer on the base insulating layer such that the solder resist layer covers the conductor layer, forming, in the solder resist layer, openings such that the openings expose the conductor pads, respectively, forming plating bumps on the conductor pads such that each of the plating bumps includes a base plating layer and a top plating layer, roughening a portion of a side surface of the base plating layer protruding from the solder resist layer such that the portion of the side surface has a rough surface before reflowing the top plating layer, and reflowing the top plating layer of each of the plating bumps formed on the conductor pads after the portion of the side surface of the base plating layer is roughened. The forming of the plating bumps includes forming, in a respective one of the openings of the solder resist layer, the base plating layer having an upper surface and the side surface including the portion protruding from the solder resist layer, and forming the top plating layer on the base plating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
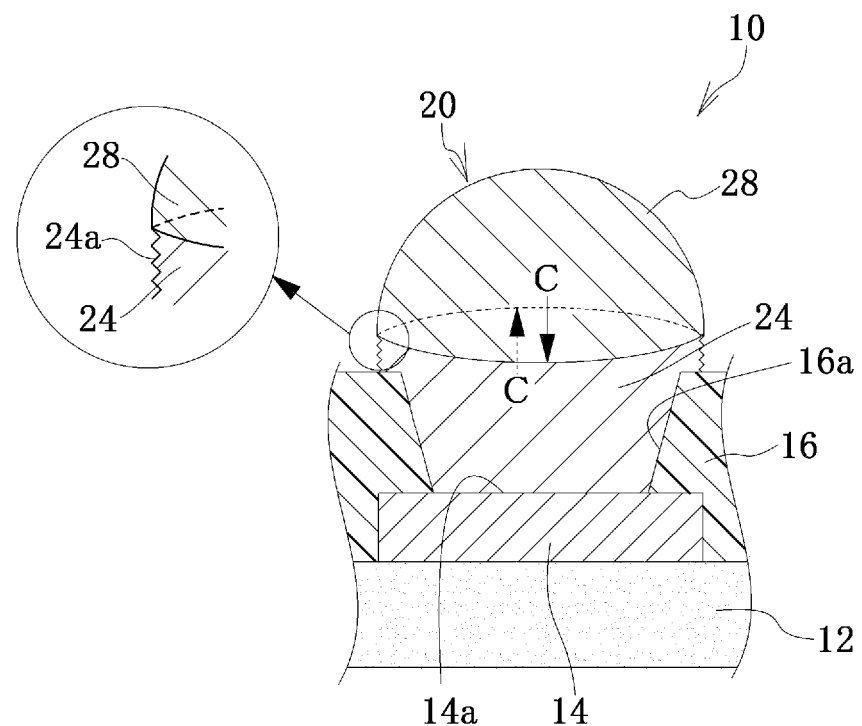
FIG. 1 is a cross-sectional view for describing a structure of a plating bump in a printed wiring board according to an embodiment of the present invention.

Embodiments will now be described with reference to the accompanying drawings, wherein like reference numerals designate corresponding or identical elements throughout the various drawings.

Printed Wiring Board

A printed wiring board according to an embodiment of the present invention is described below with reference to the drawings. In the examples illustrated in FIGS. 1 and 2, dimensions of members, especially dimensions in a height direction, are described with dimensions different from actual dimensions to facilitate better understanding.

FIG. 1 is a cross-sectional view for describing a structure of a plating bump in a printed wiring board according to an embodiment of the present invention. FIG. 1 illustrates an enlarged view of a portion of a printed wiring board 10 of the embodiment. The printed wiring board 10 may be a substrate with a core formed by alternately laminating conductor layers and resin insulating layers on one side or both sides of a core substrate (not illustrated in the drawings), the conductor layers having predetermined circuit patterns. When the conductor layers are formed on both sides of the core substrate, conductor layers opposing each other via the core substrate may be connected to each other via through-hole conductors (not illustrated in the drawings). Or, the printed wiring board 10 may be a coreless substrate obtained by alternately laminating conductor layers and resin insulating layers on a support plate (not illustrated in the drawings) instead of a core substrate and then removing the support plate.

In any case, as illustrated in FIG. 1, the printed wiring board 10 includes at least a base insulating layer 12, which is formed outermost among the resin insulating layers, a conductor layer 14, which is formed on the base insulating layer 12 and has a predetermined circuit pattern, and a solder resist layer 16, which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one base insulating layer 12 and one conductor layer 14.

The base insulating layer 12 can be formed of, for example, a resin composition or the like containing an inorganic filler, such as silica or alumina, and an epoxy resin. The conductor layer 14 is formed of a conductive metal, for example, a metal containing copper as a main component.

The solder resist layer 16 has an opening (16a) exposing a portion of the conductor layer 14 as a conductor pad (14a). An aspect ratio of the opening (16a), that is, a ratio of a depth to a diameter at a bottom thereof can be 0.5 or less. An underlayer (not illustrated in the drawings) may be formed on the conductor pad (14a). As the underlayer, a nickel layer formed on a surface of the conductor pad (14a), a palladium layer formed on the nickel layer, and a gold layer formed on the palladium layer can be exemplified. In addition, a nickel layer and a gold layer formed on the nickel layer can be exemplified.

The printed wiring board 10 further includes a plating bump 20 formed on the conductor pad (14a). The plating bump 20 can be used for connection to a power supply or a ground line or for connecting to a signal line. The plating bump 20 includes a base plating layer 24 formed in the opening (16a), and a top plating layer 28 formed on the base plating layer 24. An upper surface of the base plating layer 24 can be a flat surface, a concave curved surface with a curvature (C), or a convex curved surface with a curvature (C), depending on an intended use. An intermediate layer (not illustrated in the drawings) containing nickel as a main component, for example, can be formed on the base plating layer 24. The intermediate layer preferably has a thickness of 7 μm or less.

The base plating layer 24 is formed of a conductive metal, preferably a metal containing copper as a main component. The base plating layer 24 is formed to a height exceeding a surface of the solder resist layer 16 (a surface on the opposite side with respect to the base insulating layer 12). As a result, the plating bump 20 is stably held in the opening (16a). A thickness of the base plating layer 24 measured from the surface of the solder resist layer 16 is preferably in a range of 3 μm-20 μm. The top plating layer 28 is formed of a metal, which has a lower melting point than the base plating layer 24 and which is melted by a reflow treatment and is shaped into a substantially hemispherical shape as illustrated in FIG. 1, for example, a metal containing tin as a main component. A thickness of the top plating layer 28 (a distance in a vertical direction measured from a lower end of the top plating layer 28 to a top of the top plating layer on an outer peripheral surface of the bump 20) is preferably in a range of 5 μm-45 μm. By setting the thickness of the top plating layer 28 in this range, good connection reliability can be achieved between the plating bump 20 and a connection pad (not illustrated in the drawings) of an electronic component such as a semiconductor chip or a memory mounted on the printed wiring board 10.

In the example illustrated in FIG. 1, a feature of the printed wiring board 10 according to an embodiment of the present invention is that a side surface of the base plating layer 24 protruding from the solder resist layer 16 has a rough surface (24a), and the top plating layer 28 covers only the upper surface of the base plating layer 24. Here, a surface roughness (Ra) of the rough surface (24a) of the base plating layer 24 is preferably 0.35 μm-1.0 μm. According to the printed wiring board 10 of the present embodiment, due to the presence of the rough surface (24a) formed on the side surface of the base plating layer 24 protruding from the solder resist layer 16, when the top plating layer 28 is reflowed to form the hemispherical bump 20, the reflowed top plating layer 28 can be prevented from sagging onto the side surface of the base plating layer 24, and the bump 20 can be maintained at a predetermined height.

Figure 2:
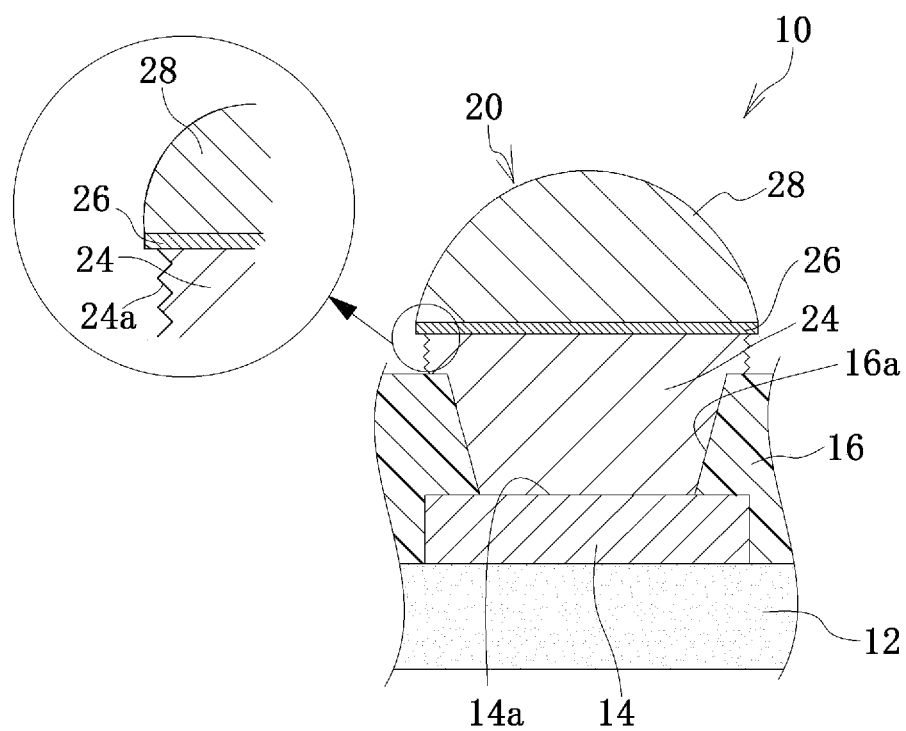
FIG. 2 is a cross-sectional view for describing a structure of a plating bump in a printed wiring board according to another embodiment of the present invention.

FIG. 2 is a cross-sectional view for describing a structure of a plating bump in a printed wiring board according to another embodiment of the present invention. Among the components illustrated in FIG. 2, components that are the same as in the components illustrated in FIG. 1 are indicated using the same reference numeral symbols and description thereof is omitted. The other embodiment illustrated in FIG. 2 differs from the embodiment illustrated in FIG. 1 in that, in addition to the presence of the rough surface (24a) formed on the side surface of the base plating layer 24 protruding from the solder resist layer 16, an intermediate layer 26 is formed between the base plating layer 24 and the top plating layer 28, and an edge of the intermediate layer 26 protrudes from the side surface of the base plating layer 24 The intermediate layer 26 can be formed of, for example, a metal containing nickel as a main component.

According to the above-described printed wiring board 10 of the other embodiment of the present invention, in addition to the effect of preventing the reflowed top plating layer 28 from sagging onto the side surface of the base plating layer 24 by the rough surface (24a) of the embodiment illustrated in FIG. 1, the intermediate layer 26 protruding from the side surface of the base plating layer 24 can prevent the reflowed top plating layer 28 from sagging onto the side surface of the base plating layer 24, and the reflowed top plating layer 28 can be even more effectively prevented from sagging onto the side surface of the base plating layer 24.

Method for Manufacturing Printed Wiring Board

In the following, a method for manufacturing a printed wiring board 10 according to an embodiment of the present invention is described with reference to FIGS. 3A-3D.

Figure 3A:
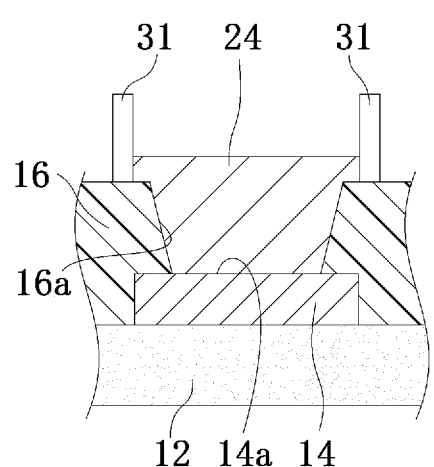
FIGS. 3A-3D are each a diagram for describing a process of a method for manufacturing a printed wiring board according to an embodiment of the present invention.

FIG. 3A illustrates an intermediate in which, using known methods, in the plating bump 20, the conductor layer 14 having a predetermined circuit pattern, the solder resist layer 16, and a plating resist 31 are formed on the base insulating layer 12, and the base plating layer 24 is formed in an opening of the plating resist 31. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12.

For the base insulating layer 12, an insulating resin film for a build-up layer containing inorganic filler such as silica or alumina and an epoxy resin can be used. In the solder resist layer 16, for example, using carbon dioxide gas laser or UV-YAG laser or the like, the opening (16a) exposing a portion of the conductor layer 14 as the conductor pad (14a) is formed. An aspect ratio of the opening (16a) is preferably 0.5 or less. On the conductor pad (14a), an underlayer (not illustrated in the drawings) may be formed, for example, by laminating in this order a nickel layer, a palladium layer, and a gold layer by plating. The base plating layer 24 is formed by, for example, performing an electrolytic plating treatment via the plating resist 31 of a predetermined pattern that is formed on the solder resist layer 16 and has the opening at a planned formation site of the plating bump 20.

Figure 3B:
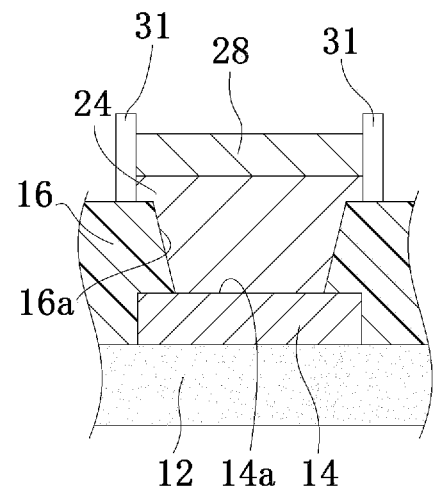

Next, as illustrated in FIG. 3B, in the plating bump 20, for example, by performing electrolytic plating using tin in the plating resist 31 and then removing the plating resist 31, the top plating layer 28 formed of tin is formed on the base plating layer 24.

Figure 3C:
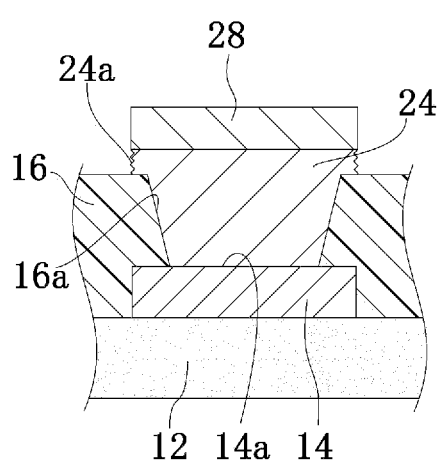
Figure 3D:
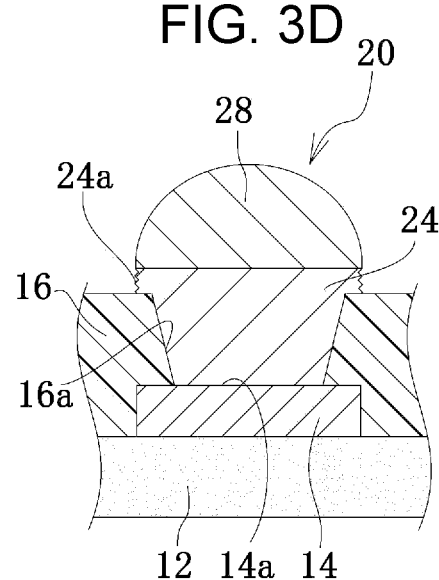

Next, as illustrated in FIG. 3C, the side surface of the base plating layer 24 protruding from the solder resist layer 16 is roughened to form the rough surface (24a). The rough surface (24a) of the side surface of the base plating layer 24 is formed by forming the plating bump 20 and then roughening the side surface of the base plating layer 24 with an alkaline roughening treatment. After that, as illustrated in FIG. 3D, the plating bump 20 can be obtained by reflowing the top plating layer 28.

In the present embodiment, the rough surface (24a) of the side surface of the base plating layer 24 is formed by forming the plating bump 20 and then roughening the side surface of the base plating layer 24 with an alkaline roughening treatment. However, as illustrated in FIG. 3B, it is also possible that, when the plating resist 31 is removed, the rough surface (24a) of the side surface of the base plating layer 24 is obtained at the same time as removing the plating resist 31 by etching. In this case, the rough surface (24a) of the side surface of the base plating layer 24 can be formed without the need to be formed in another process as illustrated in FIG. 3C, and thus can be formed with a simple structure.

Figure 4:
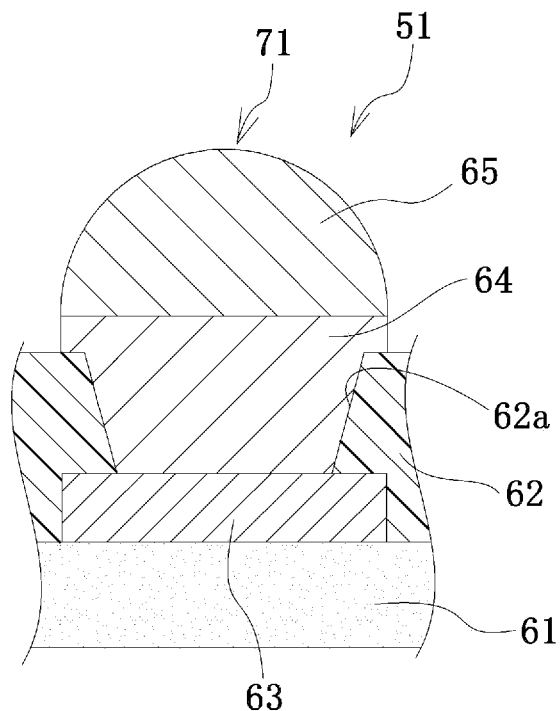
FIG. 4 illustrates a conventional printed wiring board having multiple plating bumps.

FIG. 4 illustrates a conventional plating bump of a printed wiring board having multiple plating bumps. In FIG. 4, in a printed wiring board 51, a solder resist layer 62 is formed on a base insulating layer 61, a base plating layer 64 is formed on a conductor pad 63 in an opening (62a) formed in the solder resist layer 62, a top plating layer 65 is formed on the base plating layer 64, and the top plating layer 65 is reflowed to form a plating bump 71.

Figure 5:
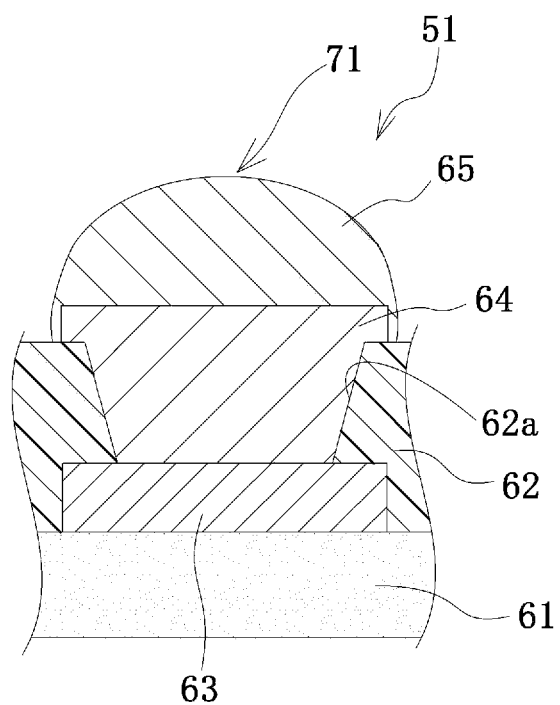
FIG. 5 is a diagram for describing a problem in a conventional printed wiring board having multiple plating bumps.

In this case, as illustrated in FIG. 5, during a heat treatment such as reflow of the top plating layer 65 formed of, for example, Sn, it is possible that the melted Sn sags down onto a side surface of the base plating layer 64, an amount of Sn of the top plating layer 65 decreases, and a height of the bump 71 decreases. As a result, in a case of mounting by a customer, a contact failure between a terminal of a mounting component and the bump 71 has occurred.

A printed wiring board according to an embodiment of the present invention has multiple plating bumps and includes: a base insulating layer; a conductor layer that is formed on the base insulating layer; and a solder resist layer that is formed on the base insulating layer and on the conductor layer, and has multiple openings each exposing a portion of the conductor layer as a conductor pad. The plating bumps each include: a base plating layer that is formed in one of the openings of the solder resist layer, and has an upper surface and a side surface protruding from the solder resist layer; and a top plating layer that is formed in a hemispherical shape on the base plating layer. The side surface of the base plating layer protruding from the solder resist layer has a rough surface. The top plating layer covers only an upper surface of the base plating layer.

A method for manufacturing a printed wiring board having multiple plating bumps according to an embodiment of the present invention includes: forming a base insulating layer; forming a conductor layer on the base insulating layer; forming a solder resist layer on the base insulating layer and on the conductor layer; forming, in the solder resist layer, multiple openings each exposing a portion of the conductor layer as a conductor pad; forming the plating bumps by: forming, in each of the openings, a base plating layer having an upper surface and a side surface protruding from the solder resist layer; forming a top plating layer on the base plating layer; and reflowing the top plating layer; roughening the side surface of the base plating layer protruding from the solder resist layer to form a rough surface; and covering only the upper surface of the base plating layer with the top plating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a base insulating layer;
a conductor layer formed on the base insulating layer and including a plurality of conductor pads;
a solder resist layer formed on the base insulating layer such that the solder resist layer is covering the conductor layer and has a plurality of openings exposing the plurality of conductor pads, respectively; and
a plurality of plating bumps formed on the plurality of conductor pads such that each of the plating bumps includes a base plating layer formed in a respective one of the openings of the solder resist layer, and a top plating layer formed on the base plating layer,
wherein the plurality of plating bumps is formed such that the base plating layer has an upper surface and a side surface including a portion protruding from the solder resist layer and having a rough surface and that the top plating layer has a hemispherical shape and is covering only the upper surface of the base plating layer, and the plurality of plating bumps is formed such that each of the plating bumps includes an intermediate layer formed between the base plating layer and the top plating layer and that the intermediate layer has an edge portion protruding from the side surface of the base plating layer.

2. The printed wiring board according to claim 1, wherein the plurality of plating bumps is formed such that the base plating layer has one of a concave curved surface and a convex curved surface formed in a central portion of the upper surface of the base plating layer.

3. The printed wiring board according to claim 2, wherein the plurality of plating bumps is formed such that the base plating layer in each of the plating bumps has a flat upper surface.

4. The printed wiring board according to claim 2, wherein the plurality of plating bumps is formed such that the intermediate layer is not formed on the side surface of the base plating layer in a respective one of the plating bumps.

5. The printed wiring board according to claim 1, wherein the plurality of plating bumps is formed such that the top plating layer in each of the plating bumps is not formed on the side surface of the base plating layer in a respective one of the plating bumps and the top plating layer.

6. The printed wiring board according to claim 1, wherein the plurality of plating bumps is formed such that the base plating layer in each of the plating bumps has a flat upper surface.

7. The printed wiring board according to claim 3, wherein the plurality of plating bumps is formed such that the top plating layer in each of the plating bumps is not formed on the side surface of the base plating layer in a respective one of the plating bumps.

8. The printed wiring board according to claim 6, wherein the plurality of plating bumps is formed such that the top plating layer in each of the plating bumps does not extend beyond the edge portion of the intermediate layer.

9. The printed wiring board according to claim 1, wherein the plurality of plating bumps is formed such that the intermediate layer is not formed on the side surface of the base plating layer in a respective one of the plating bumps.

10. The printed wiring board according to claim 1, wherein the plurality of plating bumps is formed such that the top plating layer in each of the plating bumps does not extend beyond the edge portion of the intermediate layer.

11. The printed wiring board according to claim 1, wherein the plurality of plating bumps is formed such that the base plating layer has a concave curved surface formed in a central portion of the upper surface of the base plating layer.

12. The printed wiring board according to claim 1, wherein the plurality of plating bumps is formed such that the base plating layer has a convex curved surface formed in a central portion of the upper surface of the base plating layer.

13. The printed wiring board according to claim 1, wherein the plurality of plating bumps is formed such that the portion of the side surface protruding from the solder resist layer has the rough surface having a surface roughness Ra in a range of 0.35 µm to 1.0 µm.

14. A method for manufacturing a printed wiring board, comprising:
forming a conductor layer including a plurality of conductor pads on a base insulating layer;
forming a solder resist layer on the base insulating layer such that the solder resist layer covers the conductor layer;
forming, in the solder resist layer, a plurality of openings such that the plurality of openings exposes the plurality of conductor pads, respectively;
forming a plurality of plating bumps on the plurality of conductor pads such that each of the plating bumps includes a base plating layer and a top plating layer;
roughening a portion of a side surface of the base plating layer protruding from the solder resist layer such that the portion of the side surface has a rough surface before reflowing the top plating layer; and
reflowing the top plating layer of each of the plating bumps formed on the plurality of conductor pads after the portion of the side surface of the base plating layer is roughened,
wherein the forming of the plating bumps includes forming, in a respective one of the openings of the solder resist layer, the base plating layer having an upper surface and the side surface including the portion protruding from the solder resist layer, and forming the top plating layer on the base plating layer, the forming of the plating bumps includes forming an intermediate layer between the base plating layer and the top plating layer, and the forming of the intermediate layer includes forming an edge portion protruding from the side surface of the base plating layer.

15. The method for manufacturing a printed wiring board according to claim 14, wherein the portion of the side surface of the base plating layer is roughened after the forming of the top plating layer.

16. The method for manufacturing a printed wiring board according to claim 14, wherein the roughening of the portion of the side surface of the base plating layer includes selectively roughening the portion of the side surface of the base plating layer with an alkaline roughening treatment.

17. The method for manufacturing a printed wiring board according to claim 14, wherein the forming of the base plating layer includes forming one of a concave curved surface and a convex curved surface in a central portion of the upper surface of the base plating layer.

18. The method for manufacturing a printed wiring board according to claim 14, wherein the forming of the plating bumps includes forming the base plating layer having a flat upper surface in each of the plating bumps.

19. The method for manufacturing a printed wiring board according to claim 18, wherein the forming of the plating bumps includes forming the intermediate layer such that the intermediate layer is not formed on the side surface of the base plating layer in a respective one of the plating bumps.

20. The method for manufacturing a printed wiring board according to claim 14, wherein the reflowing of the top plating layer including reflowing the top plating layer such that the top plating layer has a hemispherical shape and covers only the upper surface of the base plating layer.

* * * * *